United States Patent
Ippoushi et al.

(10) Patent No.: US 7,380,584 B2
(45) Date of Patent: *Jun. 3, 2008

(54) PUMP-FREE WATER-COOLING SYSTEM

(75) Inventors: Shigetoshi Ippoushi, Tokyo (JP); Nobuaki Uehara, Tokyo (JP); Akira Yamada, Tokyo (JP); Tetsuro Ogushi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 593 days.

This patent is subject to a terminal disclaimer.

(21) Appl. No.: 11/008,245

(22) Filed: Dec. 10, 2004

(65) Prior Publication Data

US 2005/0155744 A1 Jul. 21, 2005

(30) Foreign Application Priority Data

Jan. 6, 2004 (JP) ............................. 2004-001030

(51) Int. Cl.
*F28D 15/00* (2006.01)
*F28D 7/04* (2006.01)
(52) U.S. Cl. ........................ 165/104.24; 165/104.29; 165/159; 165/163
(58) Field of Classification Search ........... 165/104.21, 165/104.22, 104.23, 104.24, 104.25, 104.26, 165/104.27, 104.28, 104.29, 104.33; 126/639
See application file for complete search history.

(56) References Cited

U.S. PATENT DOCUMENTS 1,900,715 A * 3/1933 Jaeger ........................ 549/248
2,220,295 A * 11/1940 Siedle ........................ 62/493

(Continued)

FOREIGN PATENT DOCUMENTS

JP 57-172190 10/1982

(Continued)

*Primary Examiner*—Cheryl J. Tyler
*Assistant Examiner*—Brandon M Rosati
(74) *Attorney, Agent, or Firm*—Oblon, Spivak, McClelland, Maier & Neustadt, P.C.

(57) ABSTRACT

A pump-free water-cooling system is provided wherein external power supply is not involved; heat can be transported in any direction; and high reliability and low thermal resistance are ensured.

The pump-free water-cooling system includes: a heat-exchange circulating solution container in which a heat-exchange circulating solution and vapor of the circulating solution are contained; a heat radiator provided on the outer wall of the container; a solution outlet for discharging from the container the heat-exchange circulating solution in the container; a gas-liquid two-phase fluid inlet for charging into the container gas-liquid two-phase fluid composed of the heat-exchange circulating solution at high temperature and vapor bubbles of the circulating solution; a first transportation route along which a sensible-heat-emitting heat exchanger is provided, the first transportation route linking with the solution outlet; a second transportation route along which heat exchange is carried out between heat-exchange circulating solution therein and the heat-exchange circulating solution in the container and the vapor of the heat-exchange circulating solution in the container; a third transportation route along which a heating heat exchanger is provided, the third transportation route linking with the gas-liquid two-phase fluid inlet; and a circulating-solution transporting route in which the first transportation route, the second transportation route, and the third transportation route are linked in that order.

9 Claims, 16 Drawing Sheets

U.S. PATENT DOCUMENTS

| | | | |
|---|---|---|---|
| 3,609,991 A | * | 10/1971 | Chu et al. .................... 62/333 |
| 4,246,890 A | * | 1/1981 | Kraus et al. ................. 126/636 |
| 4,270,521 A | * | 6/1981 | Brekke ........................ 126/563 |
| 4,552,208 A | * | 11/1985 | Sorensen ................. 165/104.22 |
| 4,653,579 A | * | 3/1987 | Fujii et al. ............. 165/104.29 |
| 5,289,869 A | * | 3/1994 | Klein et al. ................. 165/273 |
| 5,351,488 A | * | 10/1994 | Sorensen ................. 60/641.11 |
| 5,557,946 A | * | 9/1996 | Sugiyama et al. ............ 62/476 |
| 5,617,737 A | * | 4/1997 | Christensen et al. .......... 62/487 |
| 6,042,342 A | * | 3/2000 | Orian ........................ 417/207 |
| 6,766,817 B2 | | 7/2004 | da Silva |
| 6,917,638 B2 | * | 7/2005 | Suzuki et al. ................. 372/36 |
| 7,201,215 B2 | * | 4/2007 | Ippoushi et al. ....... 165/104.24 |
| 2004/0194929 A1 | | 10/2004 | Ippoushi et al. |

FOREIGN PATENT DOCUMENTS

| | | |
|---|---|---|
| JP | 4-20788 | 1/1992 |
| JP | 2002-122392 | 4/2002 |

* cited by examiner

PUMP-FREE WATER-COOLING SYSTEM

BACKGROUND OF THE INVENTION

1. Field of the Invention

The present invention relates to heat transporting apparatus, more particularly to a pump-free water-cooling system that requires no external power supply such as a mechanical pump.

2. Description of the Related Art

In recent years, the calorific values of electronic apparatuses have rapidly been increasing; therefore, higher-efficiency heat radiating means have been required. In addition, the life times of the electronic apparatuses have been prolonged; therefore, higher-reliability heat radiating means have been required. Under this background, heat pipes without moving parts (e.g., refer to Patent Reference 1) have been drawing attention again. Heat pipes are roughly divided into two types, i.e., gravity-type heat pipes (thermosiphon) and capillary-type heat pipes. In a gravity-type heat pipe, an appropriate amount of working fluid is enclosed in an airtight container; and the lower portion of the gravity-type heat pipe joins with a heating element while its upper portion joins with a heat radiating portion, or is directly disposed in cooling fluid. In contrast, in a capillary-type heat pipe, an appropriate amount of working fluid is enclosed in an airtight container with grooves on its inner wall, or in an airtight container with porous substance covering its inner wall; and one end of the capillary-type heat pipe joins with a heating element while the other end joins with a heat radiating portion, or is directly disposed in cooling fluid.

Because the capillary-type heat pipe that has the structure described above refluxes working fluid to a heating portion (a portion in which a heating element is disposed) by means of capillary force, i.e., extremely small driving force, its maximal heat transportation capacity is small, and it is difficult to reflux the working fluid in the direction reverse to gravity direction; therefore, the problem of difficulty in transporting heat has been posed. In contrast, because a gravity-type heat pipe refluxes working fluid to a heating portion by utilizing gravity, there was imitation of posture, i.e., that the heat radiating portion must definitely be situated higher than the heating element; therefore, a problem has been posed wherein there was no degree of freedom in terms of installation posture.

SUMMARY OF THE INVENTION

The present invention has been implemented in order to address the foregoing issues, and it is an object to provide a high-reliability, low-thermal-resistance pump-free water-cooling system that requires no external power supply, that allows heat to be transported in any direction, and that has large heat transportation capacity and lower thermal resistance.

A pump-free water-cooling system according to the present invention includes: a heat-exchange circulating solution container in which a heat-exchange circulating solution and vapor of the circulating solution are contained; a heat radiator provided on the outer wall of the container; a solution outlet for discharging from the container the heat-exchange circulating solution in the container; a gas-liquid two-phase fluid inlet for charging into the container gas-liquid two-phase fluid including the high-temperature heat-exchange circulating solution and vapor bubbles of the circulating solution; a first transportation route along which a sensible-heat-emitting heat exchanger is provided, the first transportation route linking with the solution outlet; a second transportation route along which heat exchange is carried out between the heat-exchange circulating solution therein and the heat-exchange circulating solution in the container, or between the heat-exchange circulating solution therein, and the heat-exchange circulating solution in the container and the vapor of the heat-exchange circulating solution in the container; a third transportation route along which a heating heat exchanger is provided, the third transportation route linking with the gas-liquid two-phase fluid inlet; and a circulating-solution transporting route wherein the first transportation route, the second transportation route, and the third transportation route are linked in that order.

In the pump-free water-cooling system according to the present invention, when the heat-exchange circulating solution receives in the third transporting route heat from the heating heat exchanger, the heat-exchange circulating solution raises its temperature; boiling occurs in the third transporting route, thereby producing vapor bubbles; and the heat-exchange circulating solution and the vapor bubbles travel through the circulating-solution transporting route by means of the buoyant force that acts on the vapor bubbles. Traveling of the vapor bubbles causes part of the heat received from the heating heat exchanger to be radiated through the heat radiator provided on the outer wall of the heat-exchange circulating solution container. In addition, traveling of the heat-exchange circulating solution causes the remaining portion of the heat received from the heating heat exchanger to be radiated through the sensible-heat-emitting heat exchanger. In conventional gravity-type heat pipes, the latent heat transportation by means of vapor bubbles to the heat radiating portion is performed merely as described herein; in contrast, in the present invention, the latent heat transportation by means of vapor bubbles to the heat radiator and the sensible heat transportation by means of circulating solution to the sensible-heat-emitting heat exchanger is performed, whereby a large amount of heat can be transported. Moreover, because the heat transportation to the sensible-heat-emitting heat exchanger is performed merely by means of liquid, it is not required to provide the sensible-heat-emitting heat exchanger above the heating heat exchanger; therefore, the sensible-heat-emitting heat exchanger can be provided at any position, whereby the degree of freedom in terms of a heat-radiation position increases.

DETAILED DESCRIPTION OF THE PROFFERED EMBODIMENTS

Embodiment 1

Embodiment 1 of the present invention will be discussed below referring to the accompanying drawings.

Figure 1:
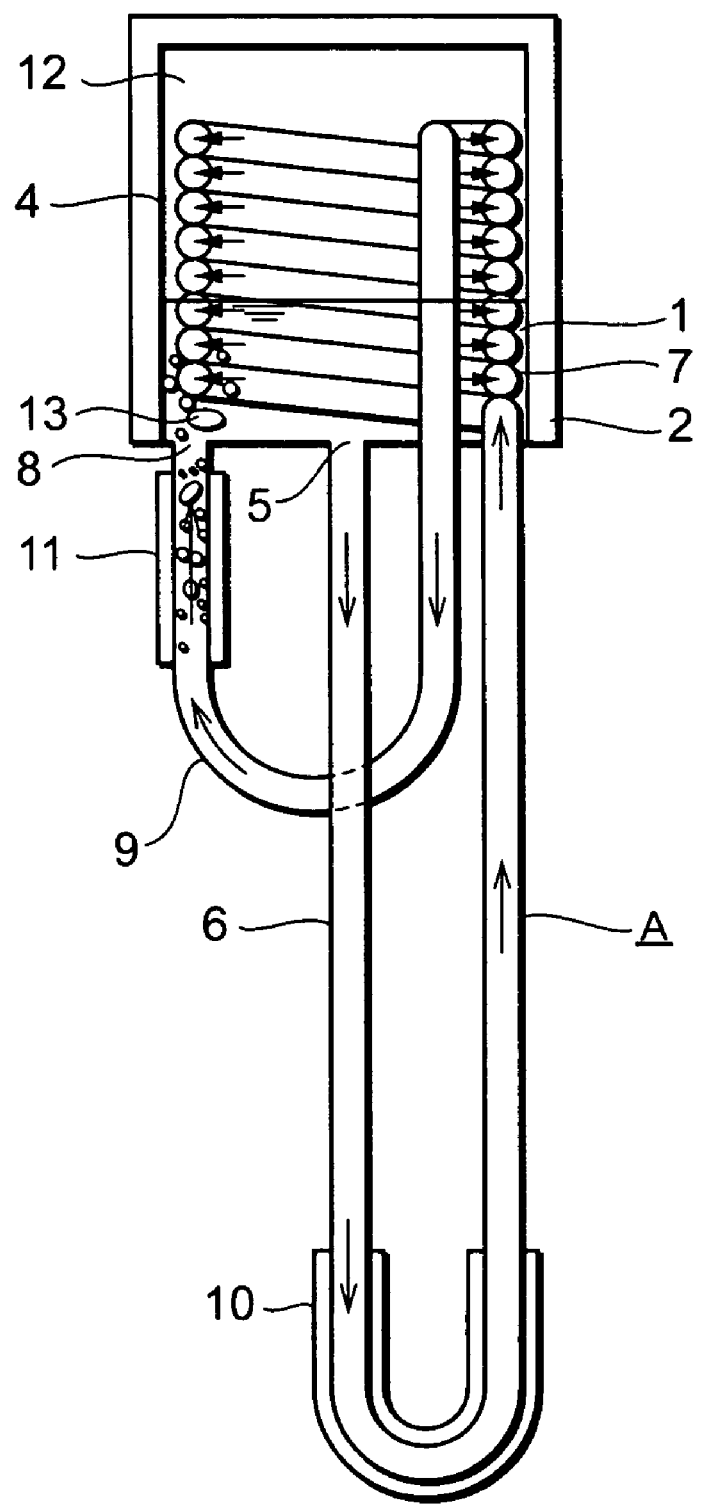
FIG. 1 is a cross-sectional schematic view illustrating a pump-free water-cooling system according to Embodiment 1 of the present invention.
Figure 2:
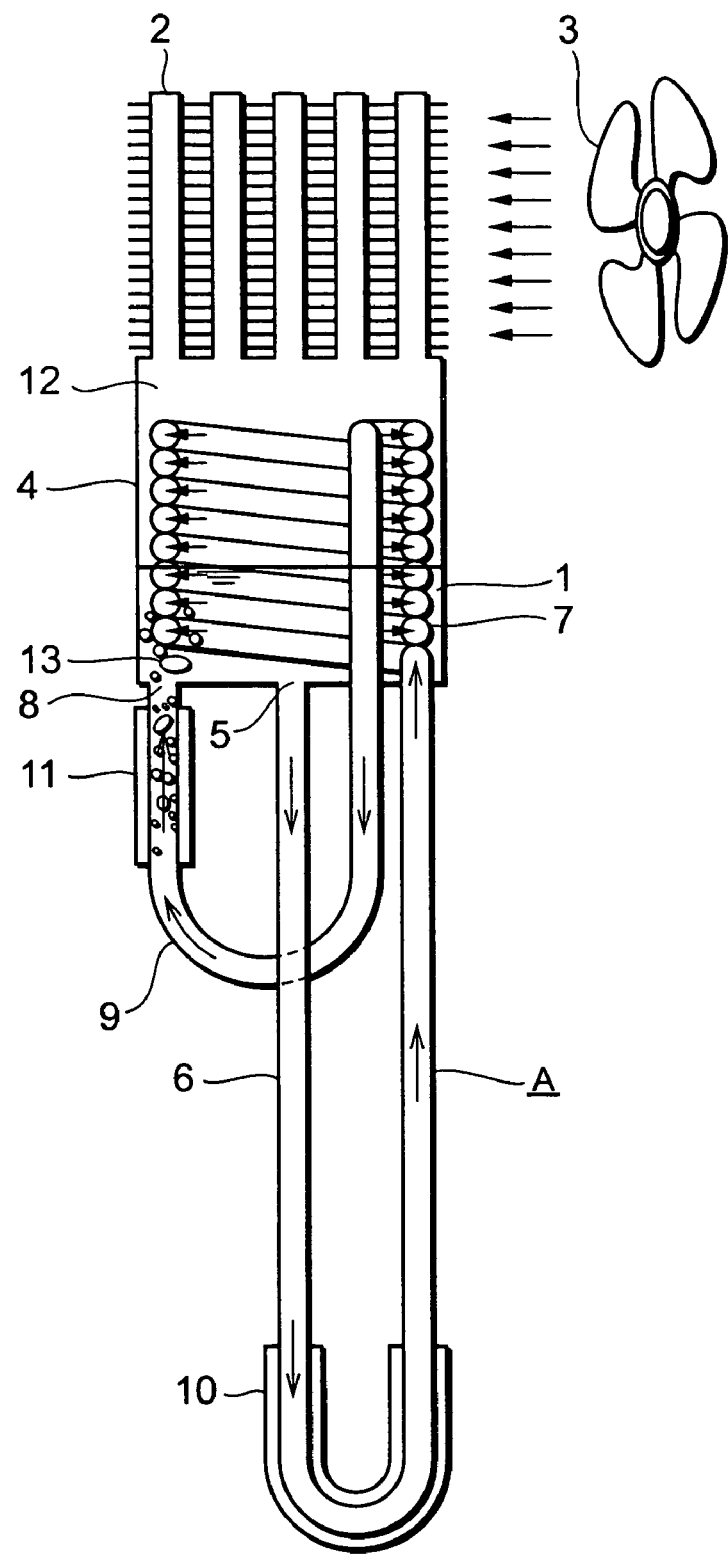
FIG. 2 is a cross-sectional schematic view illustrating another pump-free water-cooling system according to Embodiment 1 of the present invention.

FIG. 1 is a cross-sectional schematic view illustrating a pump-free water-cooling system according to Embodiment 1 of the present invention. FIG. 2 is a cross-sectional schematic view illustrating another pump-free water-cooling system according to Embodiment 1 of the present invention. In FIG. 1, a heat-exchange circulating solution container 4 contains a high-temperature heat-exchange circulating solution 1 and high-temperature vapor 12 that is produced by phase change of the solution 1 and has latent heat. In addition, a heat radiator 2 is disposed on the outer wall of the heat-exchange circulating solution container 4, whereby the heat of the heat-exchange circulating solution 1 and the vapor 12 is radiated to the heat radiator 2. In this situation, the vapor 12 is condensed into the heat-exchange circulating solution 1 successively. Moreover, in Embodiment 1, the wall surface of the heat-exchange circulating solution container 4 plays a role as a heat transferring wall for exchanging heat with the heat radiator 2, and thus fins may be disposed inside or outside the wall surface. Still moreover, the heat radiator 2 may be constituted as illustrated in FIG. 2, i.e., in such a manner that part of the outer wall of the heat-exchange circulating solution container 4 is protruded into the surroundings; fins are provided on the protruded outer wall; and further, the heat may be radiated by means of a fan 3.

The heat-exchange circulating solution container 4 is provided with a solution outlet 5 through which the heat-exchange circulating solution 1 in the container 4 is discharged. The heat-exchange circulating solution container 4 is also provided with a gas-liquid two-phase fluid inlet 8 through which gas-liquid two-phase fluid consisting of the heat-exchange circulating solution 1 and vapor bubbles 13 of the heat-exchange circulating solution 1 flows into the container 4. Still moreover, due to the influx of the gas-liquid two-phase fluid, the heat-exchange circulating solution 1 in the heat-exchange circulating solution container 4 and the condensed liquid that is produced by condensing the vapor 12 are agitated.

The heat-exchange circulating solution 1 may preferably be such liquids as have high-heat characteristics (e.g., having high heat conductivity or high specific heat), good hydrodynamic characteristics (e.g., having small viscosity coefficient), and large density ratio of liquid to gas, and the liquid that is utilized is single-ingredient liquid such as distilled water, alcohol, or liquid metal, antifreeze solution, oil, water solution such as alcohol solution, magnetic fluid, or the like, and exhibits phase change between gas and liquid. The vapor 12, which is the totally or partially gasified heat-exchange circulating solution 1, may be mixed with noncondensable gas such as air.

The solution outlet 5 provided in the heat-exchange circulating solution container 4 and the gas-liquid two-phase fluid inlet 8 are linked through a circulating solution transporting pipe A, whereby the circulating-solution transporting path through which the heat-exchange circulating solution 1 circulates is constituted.

The circulating-solution transporting pipe A includes a solution discharging pipe (the first transportation route) 6 connected to the solution outlet 5, inner-container pipes (the second transportation route) 7 that pass through the heat-exchange circulating solution container 4, a gas-liquid two-phase fluid charging pipe (the third route) 9 connected to the gas-liquid two-phase fluid inlet 8; the heat-exchange circulating solution 1 exits from the container 4 and returns to the container 4 after passing through the solution discharging pipe 6, the inner-container pipes 7, and the gas-liquid two-phase fluid charging pipe 9, in that order.

Moreover, the solution outlet 5 is for discharging the high-temperature heat-exchange circulating solution 1; however, if the vapor bubbles 13 flow along with the heat-exchange circulating solution 1 into the solution outlet 5, buoyant force acts in the direction reverse to the circulating direction of the heat-exchange circulating solution 1, whereupon the circulating flow volume of the heat-exchange circulating solution 1 is decreased; therefore, wire gauze or a blocking plate each opening of which has a diameter the same as, or smaller than, that of the vapor bubbles 13 may be disposed in the solution outlet 5 in order to prevent the vapor bubbles 13 from flowing in.

Still moreover, the gas-liquid two-phase fluid-charging pipe 9 may protrude into the heat-exchange circulating solution container 4. In this manner, larger buoyant force is generated, thereby increasing the circulating flow volume of the heat-exchange circulating solution 1, and raising heat transportation capacity.

In the circulating solution transporting pipe A, the solution discharging pipe 6 is provided with a sensible-heat-emitting heat exchanger 10, thereby radiating through the pipe wall the heat of the circulating solution that circulates through the solution discharging pipe 6. Moreover, the gas-liquid two-phase fluid-charging pipe 9 is provided with a heating heat exchanger 11, whereby the circulating solution that circulates through the solution discharging pipe 6 absorbs heat through the pipe wall and is heated up.

The heating heat exchanger 11 is a heating element such as an electronic apparatus or a heat-radiating portion of an apparatus that transports heat from the heating element; the heat radiator 2 and the sensible-heat-emitting heat exchanger 10 are heat-receiving portions of heat transportation apparatuses, such as a refrigerating-cycle apparatus and a heat pipe, or heat-radiating walls that utilize natural-and forced-convection heat transfer and radiation. In addition, instead of providing the heating heat exchanger 11, the sensible-heat-emitting heat exchanger 10, and heat radiator 2, the gas-liquid two-phase fluid charging pipe 9 on which the heating heat exchanger 11 is disposed, the solution discharging pipe 6 on which the sensible-heat-emitting heat exchanger 10 is disposed, and the heat-exchange circulating solution container 4 on which the heat radiator 2 is disposed may be installed uncovered directly in any space (such as, in the air, in the water, and in the soil) and may be heated up or made to radiate, by means of heat conduction, natural-and forced-convection heat transfer, and radiation. In that case, fins or the like may be disposed on the heat radiating walls or on the surface of the uncovered portions. Still moreover, blowing wind may be utilized as a cooling method for the heat radiator 2 and the sensible-heat-emitting heat exchanger.

Further moreover, the number of the heating heat exchanger 11 and the sensible-heat-emitting heat exchanger 10 that are disposed along the flowing path may be pluralized.

The circulating-solution transporting pipe A is a path including circular tubes for transferring the heat-exchange circulating solution 1, elliptical tubes, rectangular tubes, and corrugated tubes flexible tubes). In addition, in the circulating solution transporting pipe A, the wall surface of the gas-liquid two-phase fluid charging pipe 9 on which the heating heat exchanger 11 is disposed, the wall surface of the solution discharging pipe 6 on which the sensible-heat-emitting heat exchanger 10 is disposed, and the wall surface of the inner-container pipe 7 play a role as heat transferring wall for exchanging heat; each of the pipes may be provided inside with a turbulence facilitator for facilitating heat transfer, a spiral flow facilitator (e.g., a twisted tape), or fins, and may be a spiral tube or a meandering pipe in order to increase the heat-transferring area per unit volume. Moreover, the inner-container pipe 7 is to exchange heat between the heat-exchange circulating solution 1 inside the inner-container pipe 7, and the heat-exchange circulating solution 1 and the vapor 12 outside the inner-container pipe 7, and may be provided on its external wall surface with fins or the like.

Meanwhile, heat-insulating materials may be provided on the external wall surface, other than each foregoing wall surface, of the circulating-solution transporting pipe A.

The operation of a heat transportation apparatus according to Embodiment 1 will be described below. The heat-exchange circulating solution 1 that is enclosed in the heat-exchange circulating solution container 4 and that holds high-temperature heat circulates within the apparatus while flowing through the circulating-solution transporting pipe A; the high-temperature heat-exchange circulating solution 1, upon passing through the solution discharging pipe 6 of the circulating-solution transporting pipe A, radiates its sensible heat and exchange the heat through the sensible-heat-emitting heat exchanger 10, thereby being cooled to a low temperature. The low-temperature heat-exchange circulating solution 1, upon passing through the inner-container pipe 7 after being cooled, is preheated by the high-temperature heat-exchange circulating solution 1 enclosed in the heat-exchange circulating solution container 4, or by the high-temperature heat-exchange circulating solution 1 and the vapor 12 of the circulating solution, thereby raising its temperature. The temperature-raised heat-exchange circulating solution 1 is further heated up to a high temperature by the heating heat exchanger 11, thereby boils, and returns to the heat-exchange circulating solution container 4 while generating the vapor bubbles 13. The heat-exchange circulating solution 1 that has returned to the heat-exchange circulating solution container 4 and the vapor bubbles 13 (becoming the vapor 12) radiate heat to the heat radiator 2 disposed on the outer wall of the heat-exchange circulating solution container 4, whereupon the vapor 12 is condensed into the heat-exchange circulating solution 1 continuously. In addition, the heat-exchange circulating solution 1 that has returned to the heat-exchange circulating solution container 4 again flows through the circulating-solution transporting pipe A, thereby experiencing in cycles cooling, preheating, and temperature raising to the boiling temperature.

In the heat transportation apparatus according to Embodiment 1, the heat-exchange circulating solution 1 is made to circulate within the apparatus by utilizing the density difference (buoyant force produced by the density change), in the circulating-solution transporting pipe A, that is produced by phase change of the heat-exchange circulating solution 1. In other words, by utilizing the density difference between the apparent density of the gas-liquid two-phase fluid between the heating heat exchanger 11 and the gas-liquid two-phase fluid inlet 8, within the gas-liquid two-phase fluid charging pipe 9, and the density of the heat-exchange circulating solution 1 in the same longitudinal length as that between the heating heat exchanger 11 and the gas-liquid two-phase fluid inlet 8, within the circulating-solution transporting pipe A, the heat-exchange circulating solution 1 is made to circulate. Moreover, by repeating this circulation, the heat transferred by the heating heat exchanger 11 is transported to the sensible-heat-emitting heat exchanger 10 and the heat radiator 2, and then the sensible-heat-emitting heat exchanger 10 and the heat radiator 2 are made to transport the heat to other heat-requiring apparatuses or heat sink.

In addition, in Embodiment 1, with regard to positional relationship among the heat-exchange circulating solution container 4, the sensible-heat-emitting heat exchanger 10, and the heating heat exchanger 11, the heating heat exchanger 11 is merely required to be situated below the heat-exchange circulating solution container 4; any relationship other than between the heating heat exchanger 11 and the heat-exchange circulating solution container 4 may be different from that in the present embodiment. For instance, the sensible-heat-emitting heat exchanger 10 may be situated above the heating heat exchanger 11 and the heat-exchange circulating solution container 4.

Moreover, when the distance between the heating heat exchanger 11 and the two-phase fluid inlet 8 of the heat-exchange circulating solution container 4 is sufficiently long, the buoyant force that acts on the heat-exchange circulating solution 1 in a pipe 9a corresponding to the foregoing distance allows the heat-exchange circulating solution 1 to circulate; therefore, the heating heat exchanger 11 can be disposed horizontally.

Figure 3:
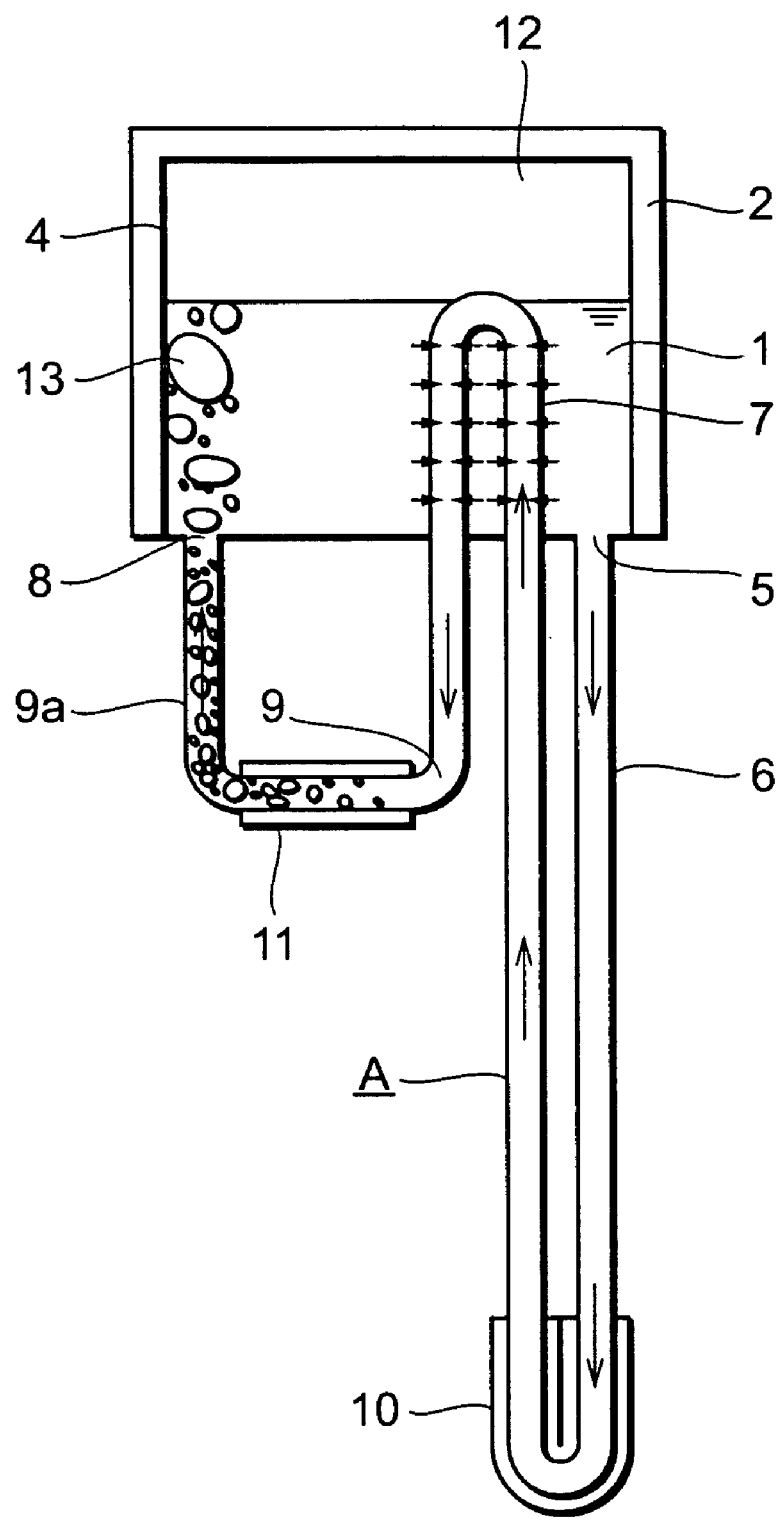
FIG. 3 is a cross-sectional schematic view illustrating another pump-free water-cooling system according to Embodiment 1 of the present invention.

FIG. 3 is a cross-sectional schematic view illustrating a pump-free water-cooling system with the heating heat exchanger 11 disposed horizontally. This manner makes horizontal-plane heat transportation possible.

In this case, it is more preferable that the heating heat exchanger 11 has its exit side slightly lifted above the horizontal axis thereof.

In FIG. 3, boiling starts from the portion on which the heating heat exchanger 11 is disposed; however, the boiling may not occur in the portion on which the heating heat exchanger 11 is disposed, but may occur in the pipe 9a. This kind of boiling is referred to as flash vaporization; and the above phenomenon occurs because the boiling does not occur in the lower side due to high pressure caused by high head pressure but starts to occur in the upper side, because the higher position in the pipe the head pressure is lower, whereby the upper side is subject to the lower pressure (the same as or lower than the saturation pressure of the liquid). Even in this situation, the heat-exchange circulating solution 1 can circulate by means of the buoyant force that acts on the heat-exchange circulating solution 1 in the pipe 9a; therefore, the heating heat exchanger 11 can be disposed horizontally.

As discussed above, in the heat transportation apparatus according to the present embodiment, the heat-exchange circulating solution, without utilizing external power supply, continuously circulates within the apparatus by taking advantage of the density difference in the heat-exchange circulating solution, a large amount of heat can be transported in any directions (such as horizontally, from a lower to a higher position, and from a higher to a lower position). In addition, long-distance heat-transportation is also possible. Moreover, the heat transportation apparatus is durability-and reliability-affluent, compact, and lightweight because it does not have any pump with a moving element.

Still moreover, heat radiation by two type of heat-radiating portions raises the heat transportation capacity, thereby decreases the thermal resistance. Furthermore, even in the case where heat load supplied by the heating heat exchanger is small, the vapor 12 is condensed by the heat radiator; therefore, the gas-liquid two-phase fluid in the third transportation route can readily move, whereby the stable circulation of the heat-exchange circulating solution is caused, and thus unstable operation such as pulsation of the solution circulation can hardly be produced. Still furthermore, because the continuous circulation occurs, and vapor bubbles that flow into the heat-exchange circulating solution container agitate the heat-exchange circulating solution and the condensed liquid produced by condensing vapor, multi-component fluid utilized as the heat-exchange circulating solution does not cause any local density hikes, thereby causing no mal-operation such as elevation of the boiling point.

Embodiment 2

Figure 4:
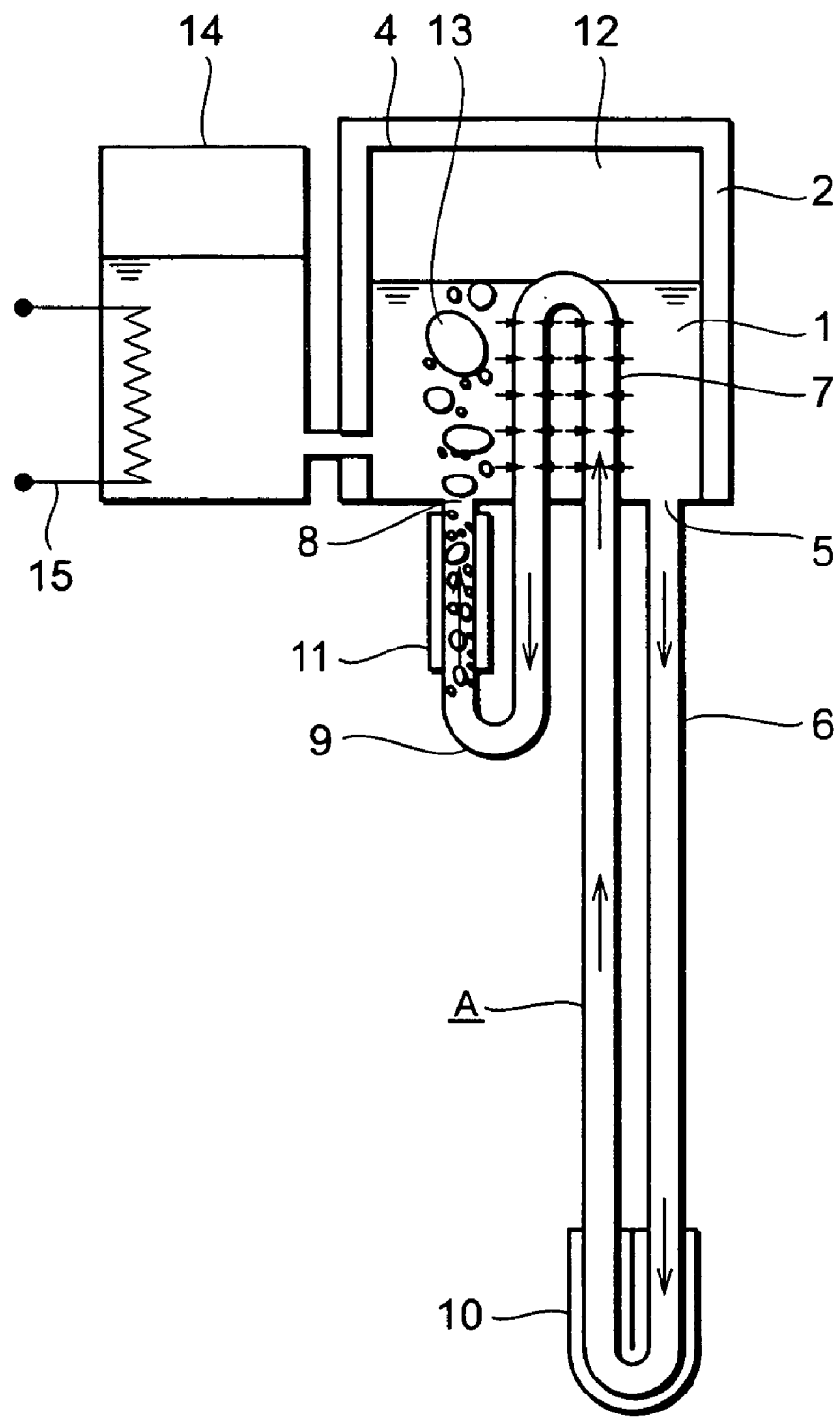
FIG. 4 is a cross-sectional schematic view illustrating a pump-free water-cooling system according to Embodiment 2 of the present invention.

FIG. 4 is a cross-sectional schematic view illustrating a pump-free water-cooling system according to Embodiment 2 of the present invention. In a pump-free water-cooling system according to Embodiment 2 of the present invention, as illustrated in FIG. 4, the heat-exchange circulating solution container 4 is provided with an auxiliary heat-exchange circulating solution container 14 coupled thereto; and a heating device 15 such as a heater is disposed in the auxiliary heat-exchange circulating solution container 14 or on the outer wall thereof.

The auxiliary heat-exchange circulating solution container 14 may preferably be disposed in a portion other than the gas-liquid two-phase fluid charging pipe between the container 4 and the heating heat exchanger 11, and should merely be disposed in such a way as to communicate with the container 4. In FIG. 4, the auxiliary heat-exchange circulating solution container 14 is communicated with the lower portion of the container 4; however, the constitution is not limitation to that illustrated in FIG. 4.

In Embodiment 2, by providing the auxiliary heat-exchange circulating solution container 14 and by controlling the temperature inside the container 14 by means of the heating device 15, the pressure inside the heat-exchange circulating solution container 4 can be adjusted, whereby the boiling temperature of the heating heat exchanger 11 can be controlled. As a result, the temperature of the heating heat exchanger 11 can be adjusted.

Moreover, by controlling the temperature inside the container 14 by means of the heating device 15, the retained volume of the heat-exchange circulating solution 1 in the container 14 can be adjusted, whereby the retained volume of the heat-exchange circulating solution 1 in the heat-exchange circulating solution container 4, or even the area, of the outer wall of the inner-container pipe 7, having contact with the vapor 12 (the area in which condensation is produced) can be varied; in consequence, the thermal resistance can be controlled through the outer wall of the inner-container pipe 7, whereby the total thermal resistance of the system according to the present invention can be controlled.

In addition, in the present embodiment, the adjustment of the pressure inside the container 4 by means of expansion and contraction of the noncondensable gas, such as air, enclosed in the container 14 may also be performed.

Moreover, with the heating device 15 disposed on the outer wall of the container 14, covering the inner wall of the container 14 with porous substances such as wire gauze keeps the inner wall of the container 14 wet by the heat-exchange circulating solution 1, thereby prevents the temperature hike due to the container 14 being dried.

Still moreover, with a peltier device provided as the heat radiator 2, changing the value and the direction of an electric current supplied to the peltier device makes possible heat radiation or heating, whereby the temperature inside the heat-exchange circulating solution container 4 can be controlled. As a result, as is the case with the foregoing embodiment, the pressure inside the heat-exchange circulating solution container 4 can be adjusted, whereby the same effect can be demonstrated. Furthermore, providing a heater on the outer wall of the heat-exchange circulating solution container 4 can control through heating by the heater the temperature inside the heat-exchange circulating solution container 4, whereby the same effect can be demonstrated.

Embodiment 3

Figure 5:
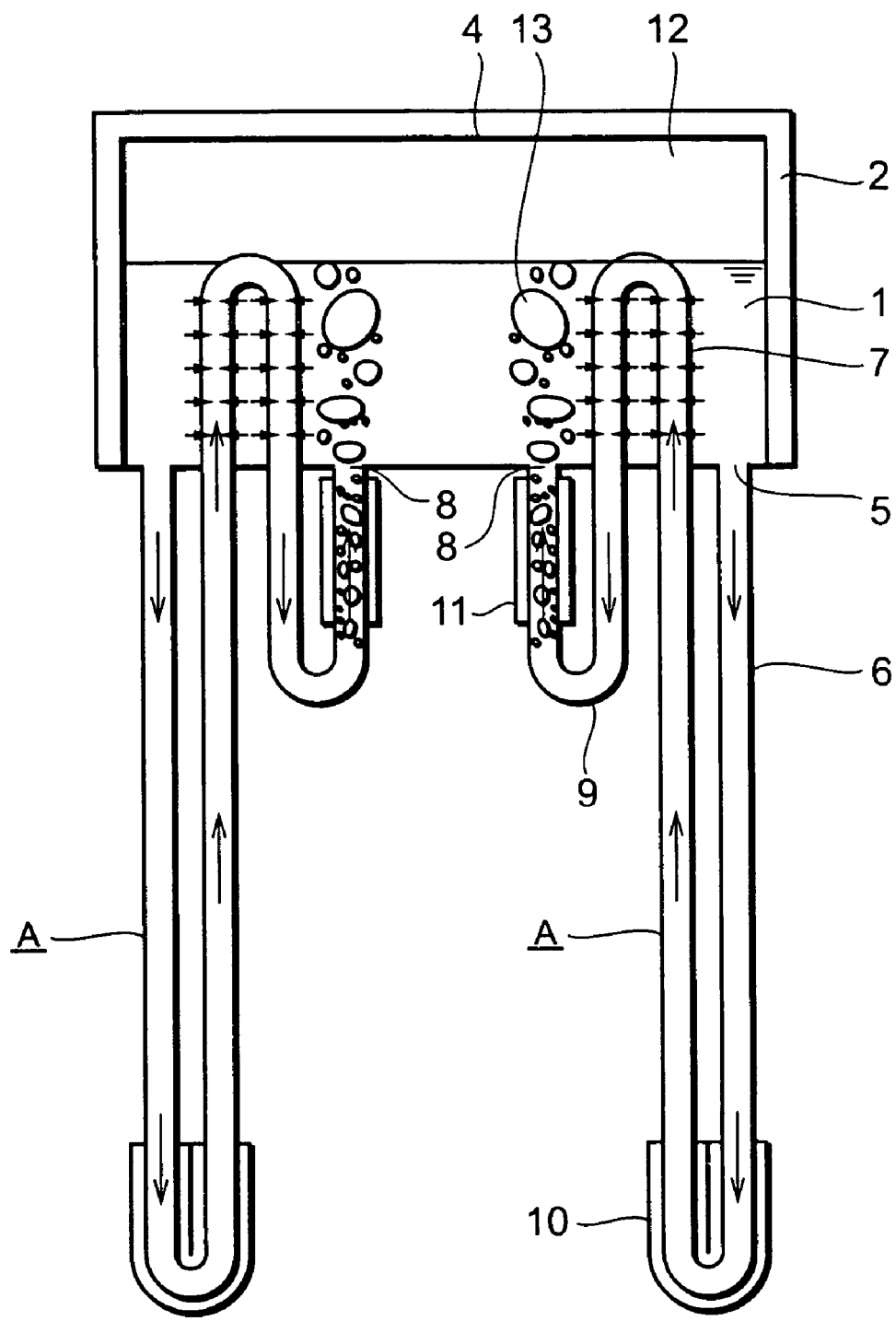
FIG. 5 is a cross-sectional schematic view illustrating a pump-free water-cooling system according to Embodiment 3 of the present invention.

FIG. 5 is a cross-sectional schematic view illustrating a pump-free water-cooling system according to Embodiment 3 of the present invention. In the present embodiment, as illustrated in FIG. 5, the heat-exchange circulating solution container 4 is provided with two circulating-solution transporting pipes A. Providing two circulating-solution transporting pipes A increases the heat-transferring area and decreases the thermal resistance. In addition, the heat transportation from scattering high-temperature heat sources, or to scattering low-temperature heat sources is facilitated. Moreover, because the heat-exchange circulating solution container 4 can be shared by a plurality of circulating-solution transporting pipes A, the water-cooling system can be downsized in comparison to that wherein a plurality of heat transportation apparatuses is provided.

Embodiment 4

Figure 6:
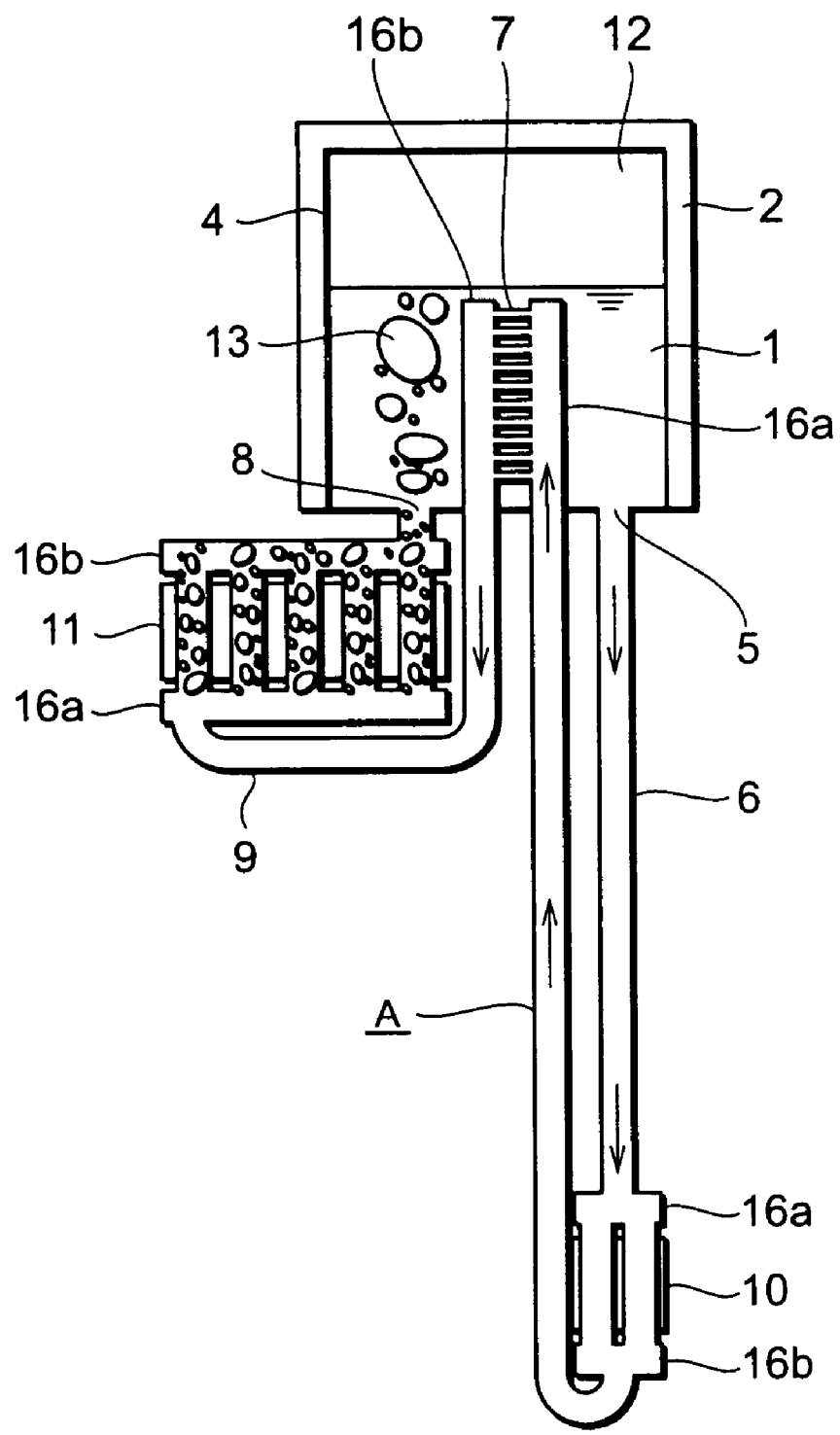
FIG. 6 is a cross-sectional schematic view illustrating a pump-free water-cooling system according to Embodiment 4 of the present invention.

FIG. 6 is a cross-sectional schematic view illustrating a pump-free water-cooling system according to Embodiment 4 of the present invention. In the present embodiment, as illustrated in FIG. 6, the portion, of the gas-liquid two-phase fluid charging pipe 9, on which the heating heat exchanger 11 has been provided, the portion, of the solution discharging pipe 6, on which the sensible-heat-emitting heat exchanger 10 has been provided, and the inner-container pipe 7 are divided by means of a distributing vessel 16a and a collecting vessel 16b, whereby a plurality of divided circulating solution transporting pipes is constituted.

This manner increases the heat-transferring area and decreases the thermal resistance. This manner also facilitates heat recovery from plane-surface, curved-surface, and formless fluid. In addition, making the plurality of divided circulating solution transporting pipes into narrow tubes can raise heat transfer, and even heat transfer characteristics.

Figure 7:
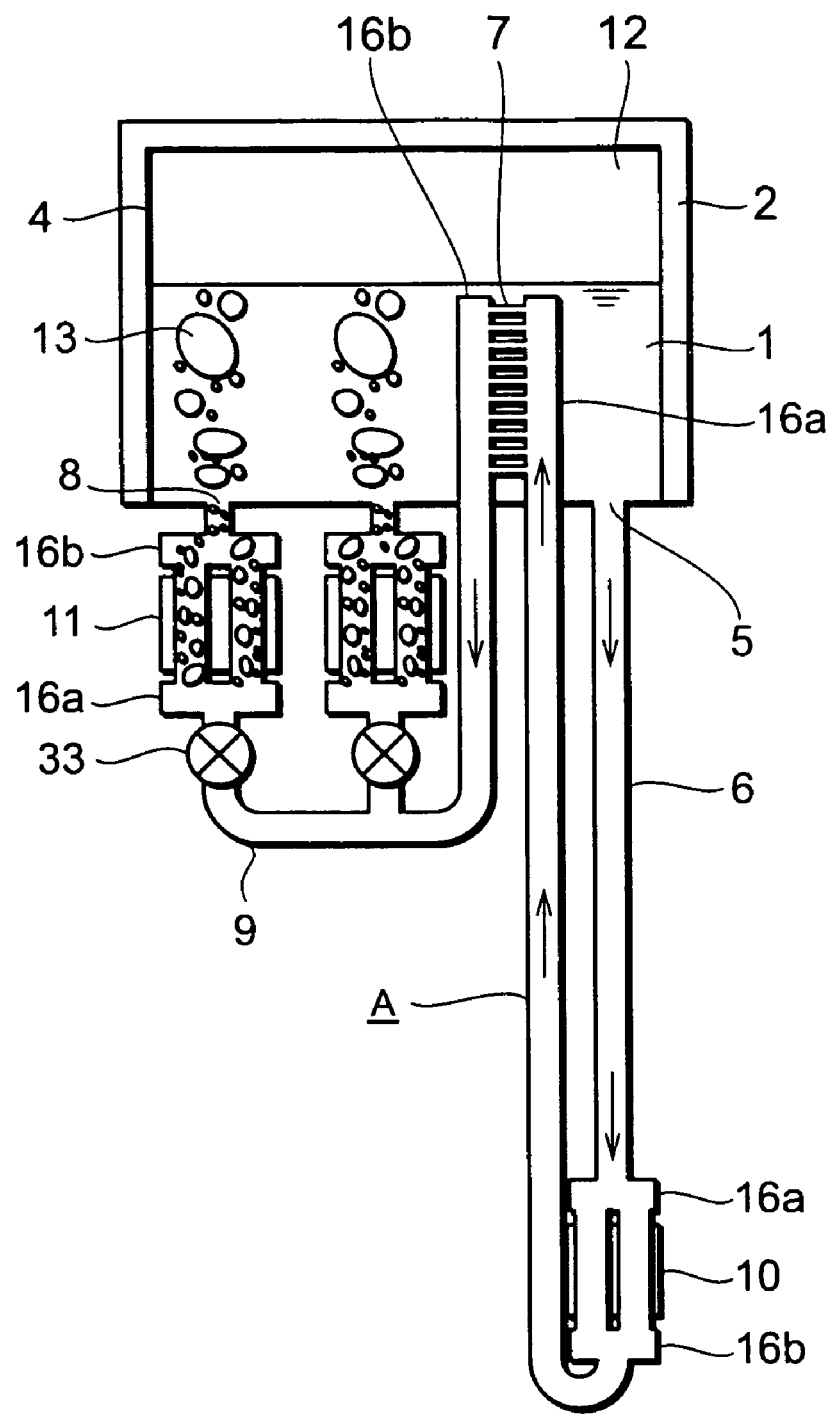
FIG. 7 is a cross-sectional schematic view illustrating another pump-free water-cooling system according to Embodiment 4 of the present invention.

FIG. 7 is a cross-sectional schematic view illustrating another pump-free water-cooling system according to Embodiment 4 of the present invention. In FIG. 7, the portion, of the gas-liquid two-phase fluid charging pipe 9, on which the heating heat exchanger 11 has been provided is divided by means of two distributing vessels 16a and two collecting vessels 16b into two gas-liquid two-phase fluid charging pipes on which respective heating heat exchangers 11 are disposed in parallel. The two collecting vessels 16b are connected directly to the circulating solution container 4 that functions as another collecting vessel. In the case of this constitution, the heat-exchange circulating solution 1 may not pass through the solution outlet 5, but may pass through any one of the heating heat exchangers and flows into another heating heat exchanger. In particular, with a non-heating heat exchanger accompanied, the heat-exchange circulating solution 1 may be refluxed to the heat-exchange circulating solution container 4 after departing from the heat-exchange circulating solution container 4 and then passing through the boiling heating heat exchanger by way of the non-heating heat exchanger. In order to prevent this reflux, as illustrated in FIG. 7, non-return valves 33 may be provided at respective upper-flow positions of the divided gas-liquid two-phase fluid charging pipes.

In addition, in FIG. 7, the non-return valves 33 are provided at upper-flow positions; however, they may be provided at lower-flow positions.

Moreover, In FIGS. 6 and 7, also when the system is constituted in such a manner that the heating heat exchangers 11 are disposed in parallel on the respective gas-liquid two-phase fluid charging pipes divided by the distributing vessel 16a (or a plurality of gas-liquid two-phase fluid charging pipes), and that the divided plurality of the gas-liquid two-phase fluid charging pipes (or the plurality of gas-liquid two-phase fluid charging pipes) are connected directly to the heat-exchange circulating solution container 4 without utilizing the collecting vessel 16b (the heat-exchange circulating solution container 4 functions as a collecting vessel), the non-return valves 33 may be provided at respective upper-flow or lower-flow positions of the divided gas-liquid two-phase fluid charging pipes (or the plurality of gas-liquid two-phase fluid charging pipes).

Figure 8:
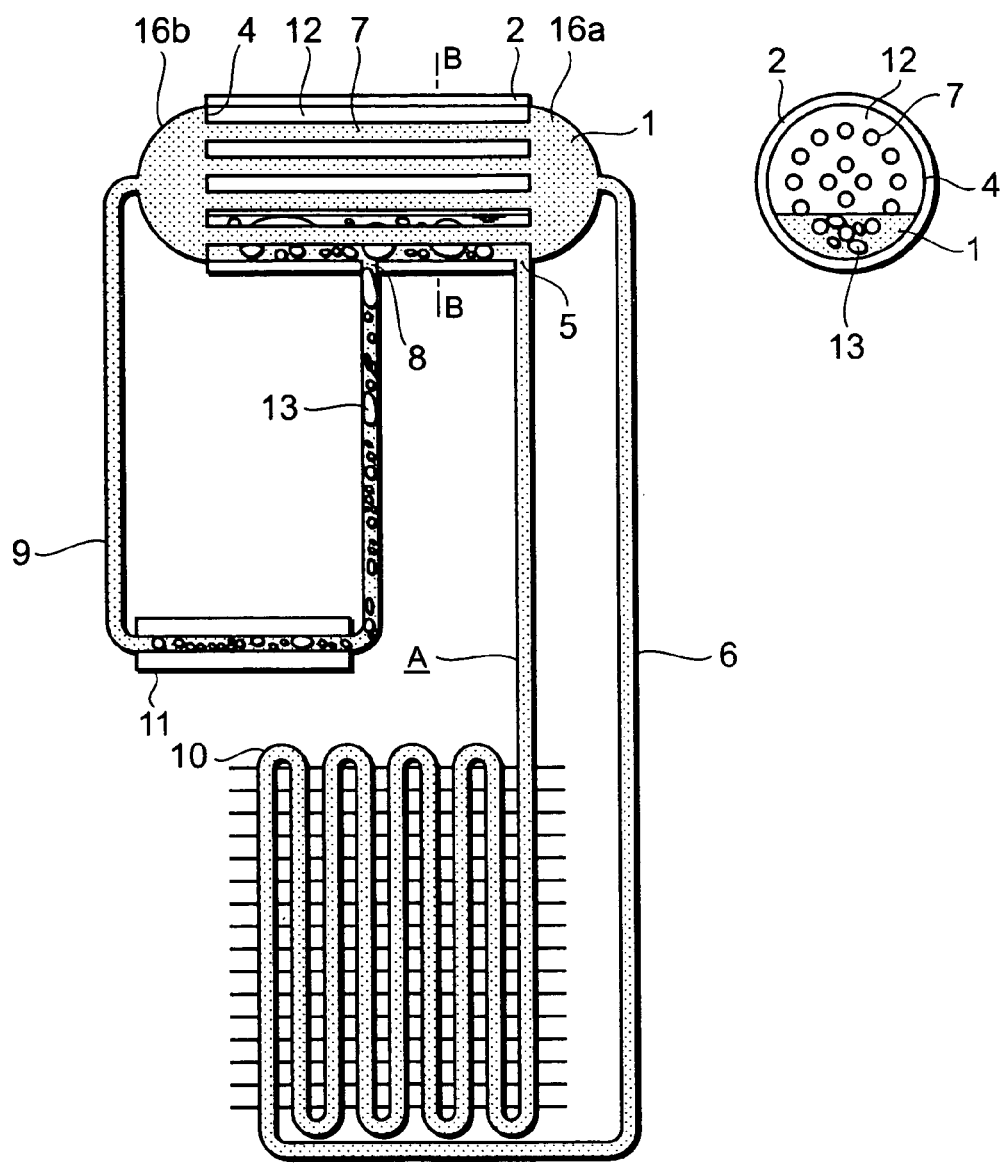
FIG. 8 is a cross-sectional schematic view illustrating another pump-free water-cooling system according to Embodiment 4 of the present invention.
Figure 9:
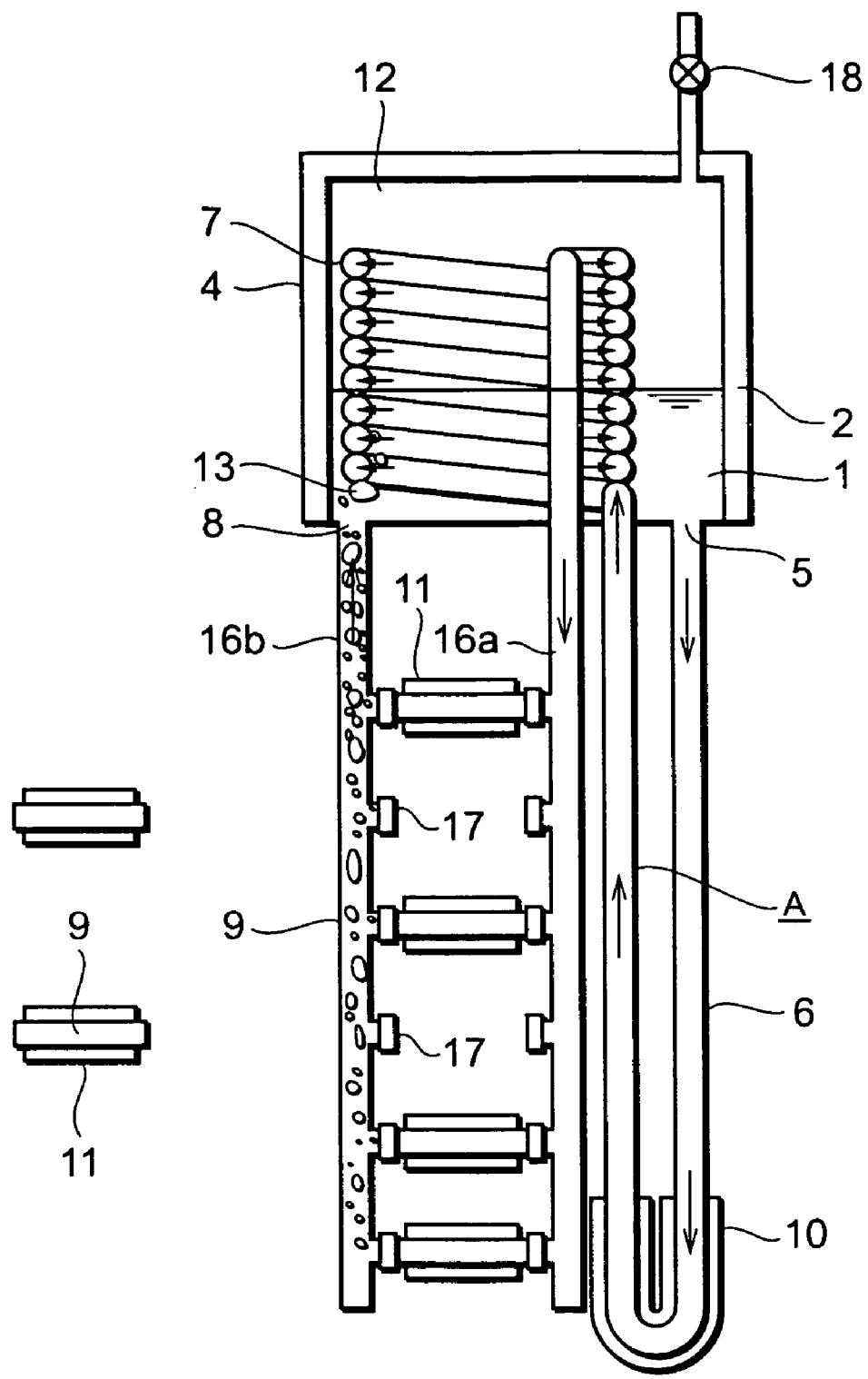
FIG. 9 is a cross-sectional schematic view illustrating another pump-free water-cooling system according to Embodiment 4 of the present invention.

Still moreover, FIG. 8 is a cross-sectional schematic view illustrating another pump-free water-cooling system according to Embodiment 4 of the present invention. FIG. 8(*b*) is a cross-sectional view of the system in FIG. 8(*a*), as viewed along B-B. As illustrated in FIG. 8, by making the system to be an integral structure wherein the heat-exchange circulating solution container 4 is horizontally elongated, and the distributing vessel 16a and the collecting vessel 16b for the inner-container pipes 7 are disposed at the both ends thereof, the structure and its production can be simplified, whereby the cost is reduced. In addition, due to the heat-exchange circulating solution container 4 being made horizontally elongated, the head-pressure change in the inner-container pipe 7 is decreased, whereby the vapor bubbles 13, in the inner-container pipe 7, produced by the change in the head pressure is not likely to occur; as a result, the pulsation of the circulating flow volume of the heat-exchange circulating solution 1 is not likely to occur, whereby provision is made for performing stable heat transportation. Moreover, FIG. 9 is a cross-sectional schematic view illustrating another pump-free water-cooling system according to Embodiment 4 of the present invention. As illustrated in FIG. 9, by providing a great number of openable and closable connecting ports (e.g., one-touch connectors) 17 along both the distributing vessel 16a and the collecting vessel 16b, the third route portions with the heating heat exchangers 11 provided thereon can be attached or detached, whereby the constitution of the pump-free water-cooling system can be modified depending on the purposes. In addition, even when the system is in operation, the constitution thereof can be modified Also in the system constituted as illustrated in FIG. 6, by providing a great number of openable and closable connecting ports (e.g., one-touch connectors) 17 along both the distributing vessel 16a and the collecting vessel 16b, the first route portion with the sensible-heat-emitting heat exchanger 10 provided thereon or the third route portions with the heating heat exchangers 11 provided thereon can be attached and detached, whereby the constitution of the pump-free water-cooling system can be modified depending on the purposes. In addition, even when the system is in operation, the constitution thereof can be modified.

Moreover, as illustrated in FIG. 9, a degassing outlet 18 provided on the heat-exchange circulating solution container 4 enables noncondensable gas that enters therethrough upon the constitutional modification or noncondensable gas that has been initially contained to be discharged, whereby the deterioration of the heat characteristics can be prevented.

Embodiment 5

Figure 10:
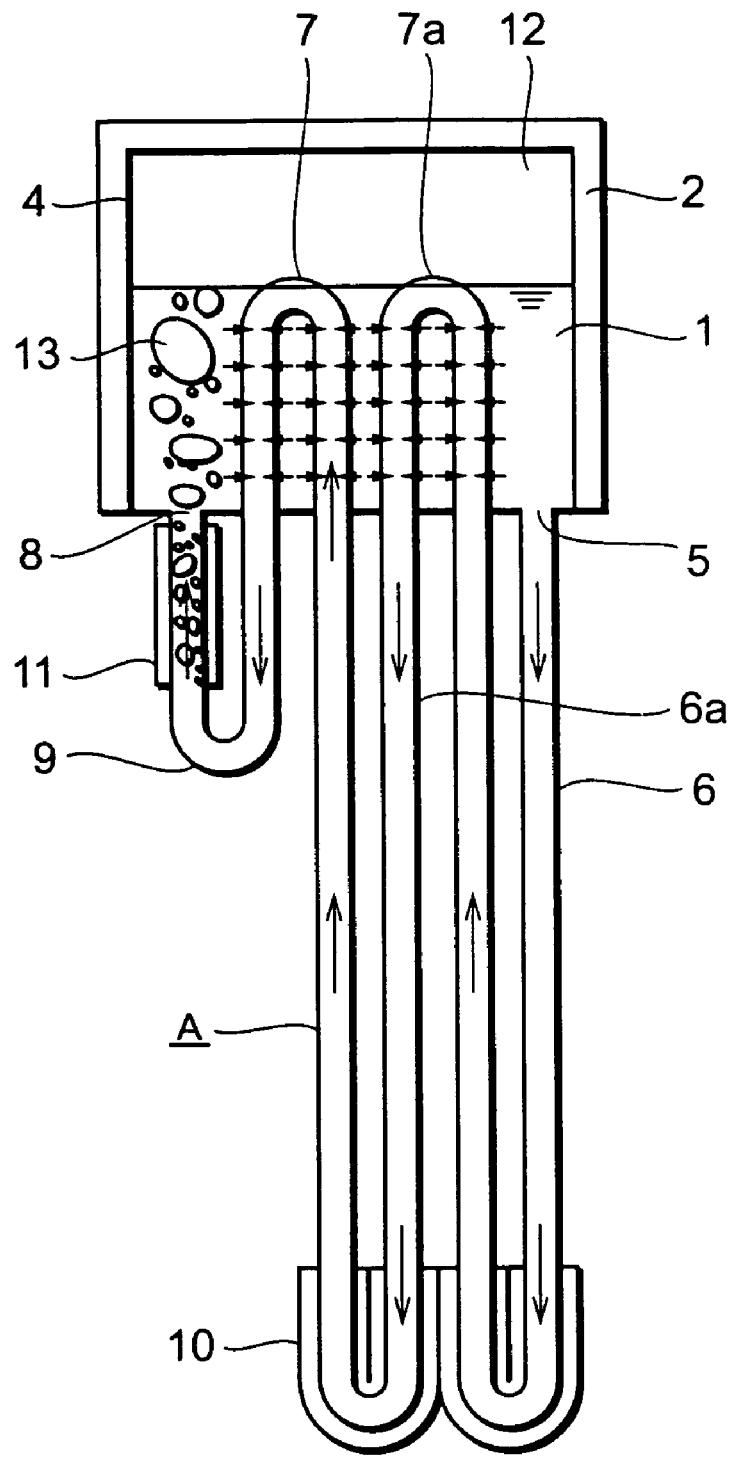
FIG. 10 is a cross-sectional schematic view illustrating a pump-free water-cooling system according to Embodiment 5 of the present invention.

FIG. 10 is a cross-sectional schematic view illustrating a pump-free water-cooling system according to Embodiment 5 of the present invention. In the present embodiment, as illustrated in FIG. 10, the circulating-solution transporting pipe A includes a single gas-liquid two-phase fluid charging pipe 9, a single solution discharging pipe 6, two inner-container pipes 7 and 7a, and a single first outer-container pipe (the fourth route) 6a provided between the two inner-container pipes 7 and 7a. The first outer-container pipe 6a is provided with the same sensible-heat-emitting heat exchanger 10 as that provided on the solution-discharging pipe 6.

This manner increases the heat-exchanging areas of inner-container pipes 7 and the portion around the sensible-heat-emitting heat exchanger 10, thereby decreases the thermal resistance.

Making the circulating-solution transporting pipe A into further parallel flowing paths by means of two or more first outer-container pipes 6a and three or more inner-container pipes 7 and 7a can decrease the frictional pressure loss during one-cycle circulation through the circulating-solution transporting pipe A, whereby the circulating flow volume of the heat-exchange circulating solution 1 can be increased (the sensible-heat-transporting volume increases). As a result, the total thermal resistance is decreased; therefore, despite small difference in temperature between the heating heat exchanger 11 and the sensible-heat-emitting heat exchanger 10, a large amount of heat can be transported. This manner further facilitates heat recovery or heat radiation from or to a planar surface of a solid, curved-surface fluid, formless fluid, or the like.

In addition, in the foregoing embodiment, different-types of the sensible-heat-emitting heat exchangers 10 and 10a may be provided on the solution discharging pipe 6 and the outer-container pipe 6a, respectively.

Figure 11:
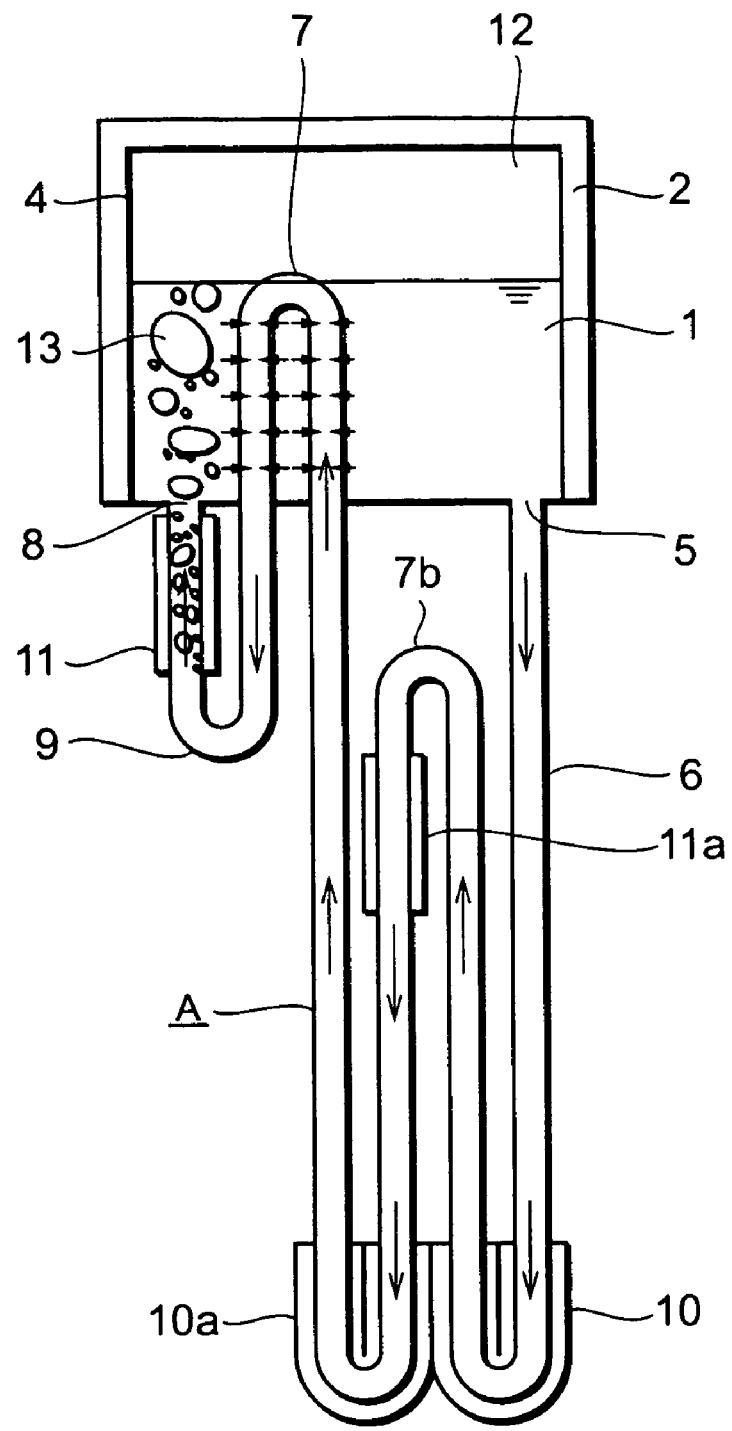
FIG. 11 is a cross-sectional schematic view illustrating another pump-free water-cooling system according to Embodiment 5 of the present invention.

In the present embodiment, the inner-container pipe 7a other than the inner-container pipe 7 that is closest to the heating heat exchanger 11 may not pass through the heat-exchange circulating solution container 4 and may be provided with another heating heat exchanger 11a. In other words, as illustrated in FIG. 11, the second outer-container pipe (the fifth transportation route) 7b provided with the heating heat exchanger 11a and the sensible-heat-emitting heat exchanger 10a may be disposed between the inner-container pipe (the second transportation route) 7 and the solution discharging pipe (the first transportation route) 6. In addition, a plurality of the second outer-container pipes (the fifth transportation route) 7b may be provided.

In this manner, the heat recovery or the heat transportation from or to the scattered heat sources can readily be performed with a single heat-exchange circulating solution container 4; and the system can be downsized.

Moreover, if the amount of heat exchanged by the heating heat exchanger 11a is smaller than that exchanged by the heating heat exchanger 11, and the heat-exchange circulating solution 1 within the second outer-container pipe on which the heating heat exchanger 11a is provided does not boil, the heating heat exchanger 11a can be disposed above the heat-exchange circulating solution container 4, whereby the degree of freedom in the location of the heating heat exchanger hikes.

The control of the heating heat exchanger 11 (e.g., controlling from outside the electric power supplied to a heater that is disposed as the heating heat exchanger 11) can adjust the circulating flow volume of the heat-exchange circulating solution 1, whereby not only heat can be transported from another heating heat exchanger 11a, but also the temperature of the heating heat exchanger 11a can be adjusted.

In addition, as described above, by disposing the heater as the heating heat exchanger 11, the positional limitation between an object onto which heat is transported (e.g., an electronic apparatus) and the heating heat exchanger 11 is eliminated; therefore, the heating heat exchanger 11 can even be disposed further lower. In this manner, the buoyant force for driving the heat-exchange circulating solution can more effectively be obtained, whereby the heat characteristics hike.

Figure 12:
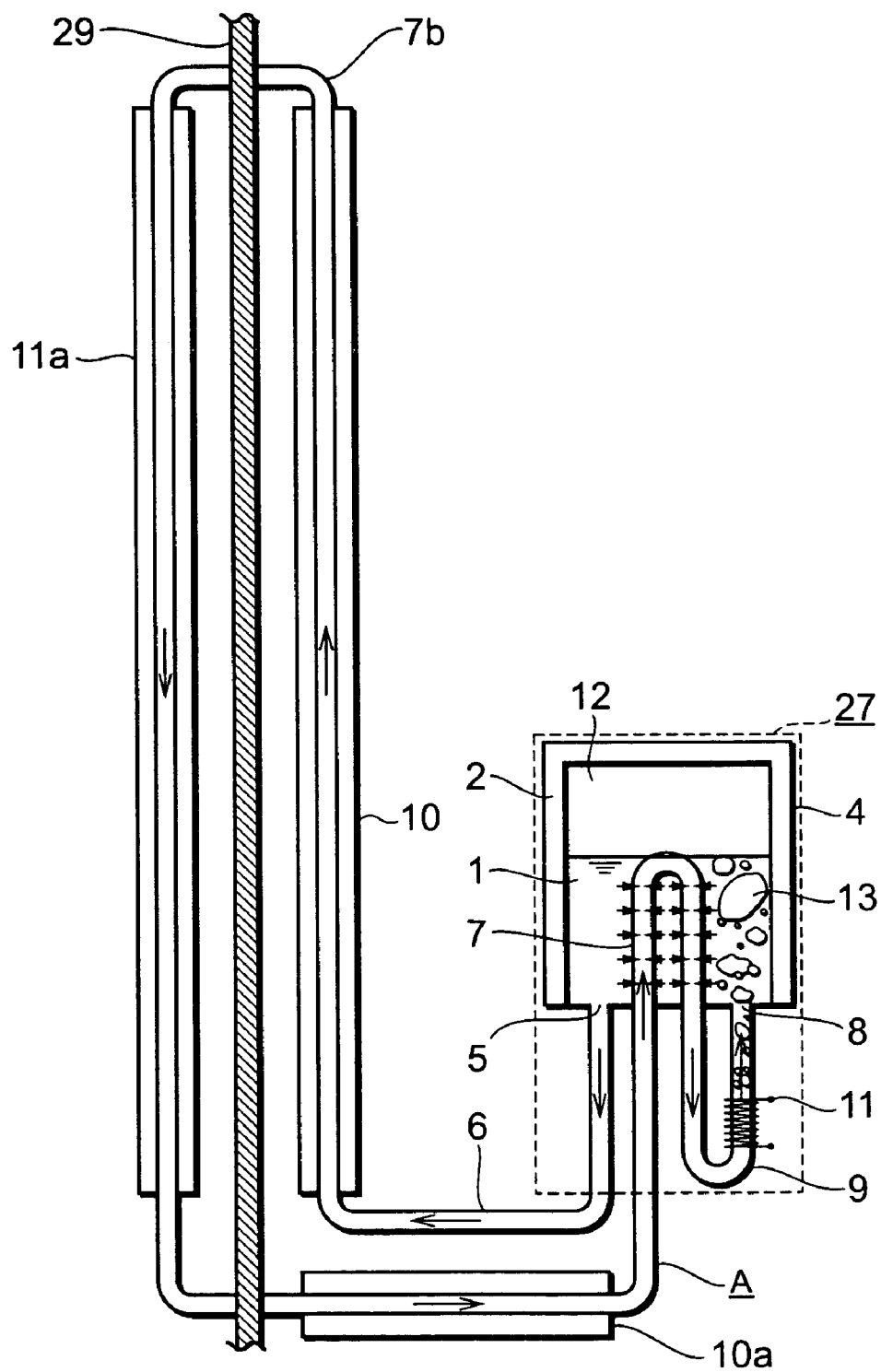
FIG. 12 is a cross-sectional schematic view illustrating another pump-free water-cooling system according to Embodiment 5 of the present invention.

Moreover, as illustrated in FIG. 12, by constituting a bubble pump module 27 (in the module 27, the heating heat exchanger 11 is situated under the heat-exchange circulating solution container 4) that contains the heat-exchange circulating solution container 4, the heat radiator 2, the solution outlet 5, the inner-container pipe 7, the gas-liquid two-phase fluid charging pipe 9, the gas-liquid two-phase fluid inlet 8, and the heating heat exchanger 11 with a heater thereon, the limitation to the installation position of the module 27 is eliminated; in consequence, provision is made for further free arrangement. Utilization of the module 27 as a general-purpose article reduces the cost of the system.

In FIG. 12, the heating heat exchanger 11a is disposed in the vicinity of an electronic component situated within a case 29, and the module 27 and a plurality of the sensible-heat-emitting heat exchangers 10 and 10a are disposed outside the case 29. Regardless of the mounting position of the electronic component, the heating heat exchanger 11a can be disposed in the vicinity of the electronic component; therefore, the heat emanating from the electronic component within the case can readily be transported outside the case.

Embodiment 6

Figure 13:
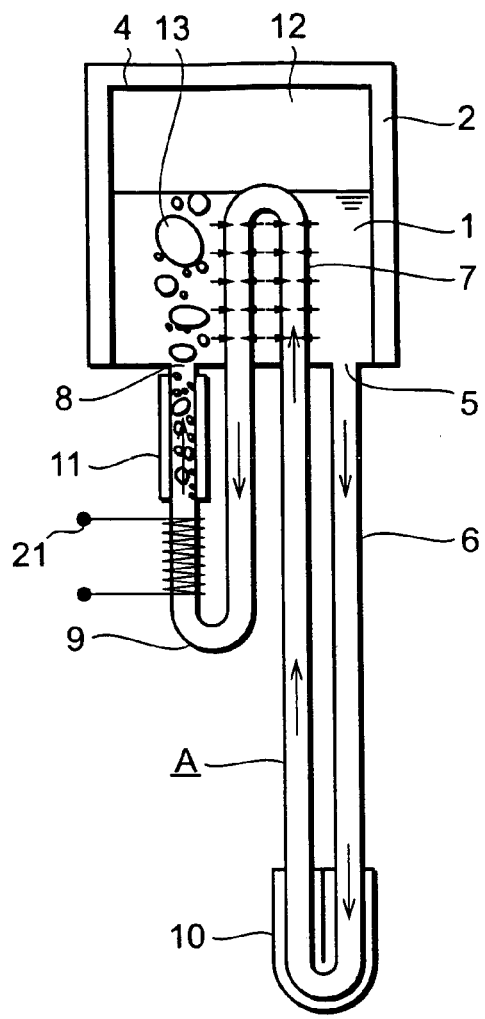
FIG. 13 is a cross-sectional schematic view illustrating a pump-free water-cooling system according to Embodiment 6 of the present invention.

FIG. 13 is a cross-sectional schematic view illustrating a pump-free water-cooling system according to Embodiment 6 of the present invention. In the present embodiment, as illustrated in FIG. 13, a auxiliary heater 21 is provided along the gas-liquid two-phase fluid charging pipe 9.

In this manner, even when the temperature difference between the heating heat exchanger 10 and the sensible-heat-emitting heat exchanger 11 is small, and the heat-exchange circulating solution 1 in the heating heat exchanger 10 does not boil, boiling in the heating heat exchanger 10 can be produced by supplying the auxiliary heater 21 with electricity, thereby heating it. This way enables the heat-exchange circulating solution 1 to circulate through the solution circulating pipe A, whereby heat can be transported even when the temperature difference is small.

If the heating heat exchanger 11 is situated horizontally, reverse flow or pulsation of the heat-exchange circulating solution 1 could occur, but operating the system with the auxiliary heater 21 provided on the rising portion of the gas-liquid two-phase fluid charging pipe 9 allows the heat-exchange circulating solution 1 to circulate normally, whereby stable start-up and heat transportation can be performed. In addition, in this case, operation of the auxiliary heater 21 only during activation is possible.

Moreover, the installation location for the auxiliary heater 21 may be below or above the heating heat exchanger 11, as illustrated in FIG. 13, so long as it is a portion in which the solution in the gas-liquid two-phase fluid charging pipe 9 rises.

Still moreover, in the case where the auxiliary heater 21 is provided below the heating heat exchanger 11, the heat-exchange circulating solution 1 flowing into the heating heat exchanger 11 is preheated, whereby the difference between the temperature of the solution 1 at the inlet of the heating heat exchanger 11 ant the saturation temperature of the solution 1 becomes smaller. Therefore, subcooled boiling, which occurs when the pressure in the system is small, and the resultant pulsation of the circulating flow volume, vibration, and noise hardly occurs.

In this case, the auxiliary heater 21 preferably is provided in such a manner that the more downstream the position along the flowing path provided the auxiliary heater 21 is, the larger the heated flux is.

Figure 14A:
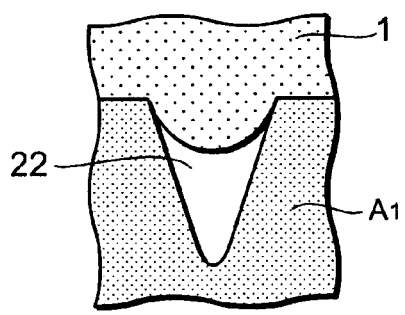
FIG. 14 is a view illustrating a bubble nucleus involving Embodiment 6 of the present invention.
Figure 14B:
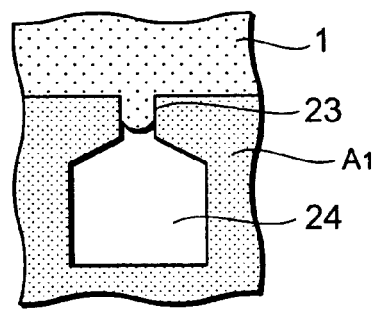
Figure 15:
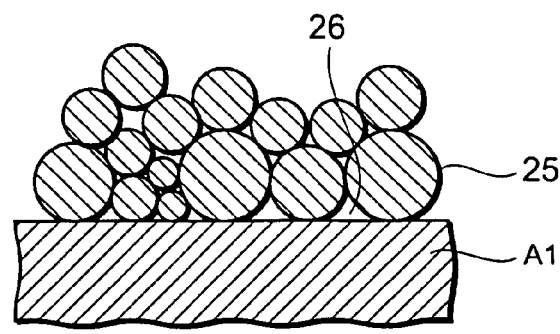
FIG. 15 is a view illustrating another bubble nucleus involving Embodiment 6 of the present invention.

In addition, bubble nuclei may be provided in the inner wall of the portion on which the auxiliary heater 21 is provided, or in the inner wall of the portion on which the heating heat exchanger 11 is provided. Bubble nuclei, which play a role in stably keeping gas remaining in the inner walls or in the fluid path, regardless of the flow and or agitation in the fluid and of temperature change of the fluid and the path wall, are, as illustrated in FIG. 14(a), scratches 22 provided in the inner-wall surface A1 of a pipe or, as illustrated in FIG. 14(b), spaces (reentrant-type cavities) 24 communicating to the fluid (the heat-exchange circulating solution) 1 through a narrow channel 23. Such a recess as illustrated in FIG. 14 may be formed by means of a mechanical or chemical process, or may be formed by covering the inner wall with wire mesh. In addition, as illustrated in FIG. 15, bubble nuclei 26 may be formed by sintering or bonding metal powder 25 onto the inner-wall surface A1.

This constitution, even when the pressure in the system is low due to the low temperature thereof, makes gas to remain in the bubble nuclei stably, it expands and a part of one breaks away from the surface A1 continuously, whereby the vapor bubbles 13 can readily be generated; therefore, the system can easily be activated, and also the heat characteristics on the surface A1 are enhanced.

Embodiment 7

Figure 16:
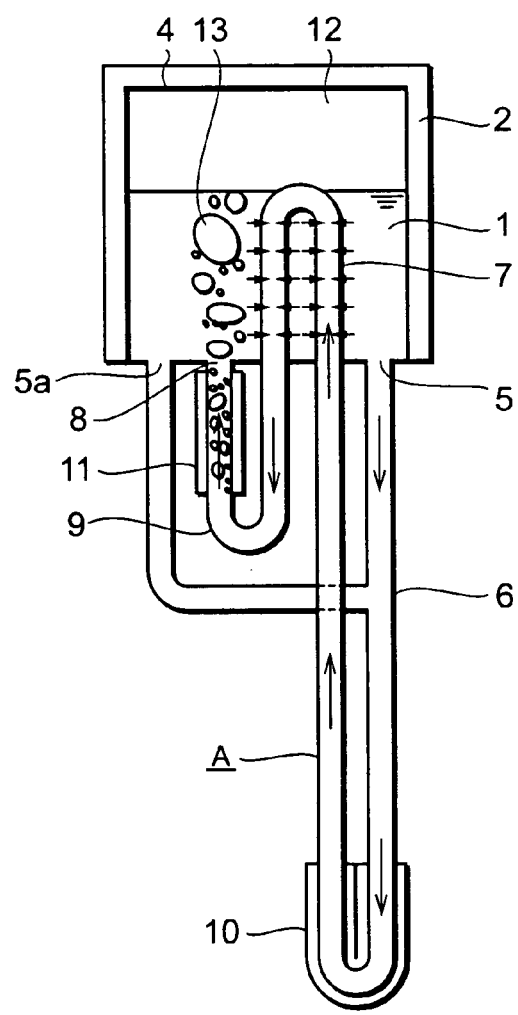
FIG. 16 is a cross-sectional schematic view illustrating a pump-free water-cooling system according to Embodiment 7 of the present invention.

FIG. 16 is a cross-sectional schematic view illustrating a pump-free water-cooling system according to Embodiment 7 of the present invention. In the present embodiment, as illustrated in FIG. 16, the solution outlet 5 and another solution outlet 5a are provided respectively at the left and right ends of the heat-exchange circulating solution container 4, and respective solution discharging pipes 6 are linked with these solution outlets 5 and 5a, and join along their ways, connecting to the inner-container pipe 7.

In cases where a pump-free water-cooling system is mounted in an automobile, due to effects of inclination and gravity, the gas-liquid interface of the heat-exchange circulating solution 1 in the heat-exchange circulating solution container 4 may fluctuate, whereupon the solution outlet 5 could be exposed in a space containing vapor. In this situation, because vapor could be taken in by the solution discharging pipe 6, the smooth circulation of the heat-exchange circulating solution 1 could be hindered, whereby the heat transportation characteristics could deteriorate. In order to address this, according to the present embodiment, by constituting a pump-free water-cooling system in such a manner that a plurality of solution outlets 5 and 5a are provided in the heat-exchange circulating solution container 4, and the respective solution discharging pipes 6 link with the plurality of solution outlets, and the linking portions join, connecting to the inner-container pipe 7, the system becomes insusceptible to the effects of left-and-right and back-and-forth inclinations, and of volumetric force (e.g., gravity).

Embodiment 8

Figure 17:
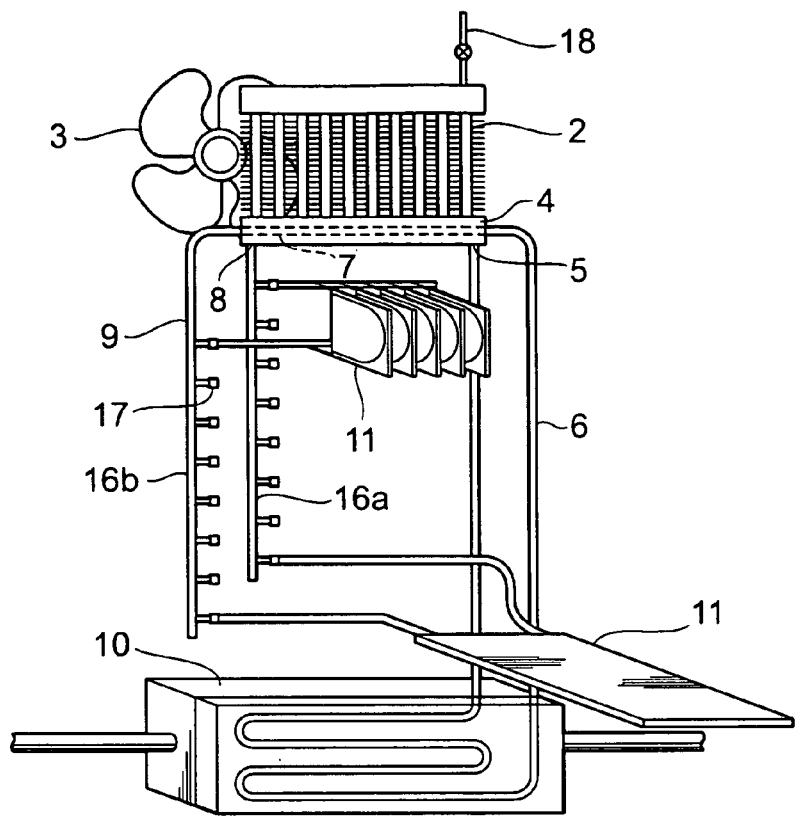
FIG. 17 is a perspective view illustrating a pump-free water-cooling system according to Embodiment 8 of the present invention.
Figure 18:
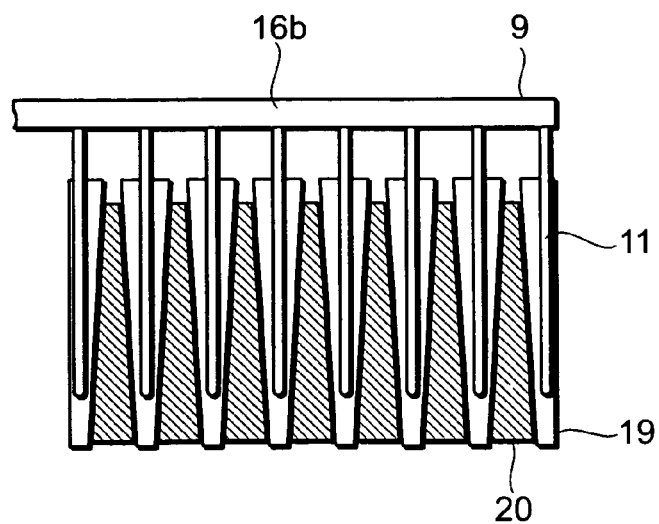
FIG. 18 is a cross-sectional schematic view illustrating a heating heat exchanger and a rack wall according to Embodiment 8 of the present invention.

FIG. 17 is a perspective view illustrating a pump-free water-cooling system according to Embodiment 8 of the present invention; and FIG. 18 is a cross-sectional schematic view illustrating the heating heat exchangers 11 and a rack wall 19 involving Embodiment 8 of the present invention. In Embodiment 8, a pump-free water-cooling system is applied to a rack for containing an electronic apparatus (e.g., such as a board-type server) 20, and is installed in such a manner that the heating heat exchangers 11 function as the mounting walls for the electronic apparatus. This way enables the heat produced by the electronic apparatus 20 to be transported and radiated, whereby the electronic apparatus 20 can be kept under its allowable temperature.

In addition, it is advisable to carry out the inserting of thermal sheets or the coating of thermal grease on the contact faces between the heating heat exchanger 11 and the electronic apparatus 20, in order to decrease the contact thermal resistance.

Moreover, as illustrated in FIG. 18, by tapering the contours of the heating heat exchanger 11 and the electronic apparatus 20, contact pressure can be obtained adequately, whereby the contact thermal resistance can be reduced.

Still moreover, the heating heat exchanger 11 may be provided on upper or bottom surface instead of on the sidewalls of the electronic apparatus 20.

Embodiment 9

Figure 19:
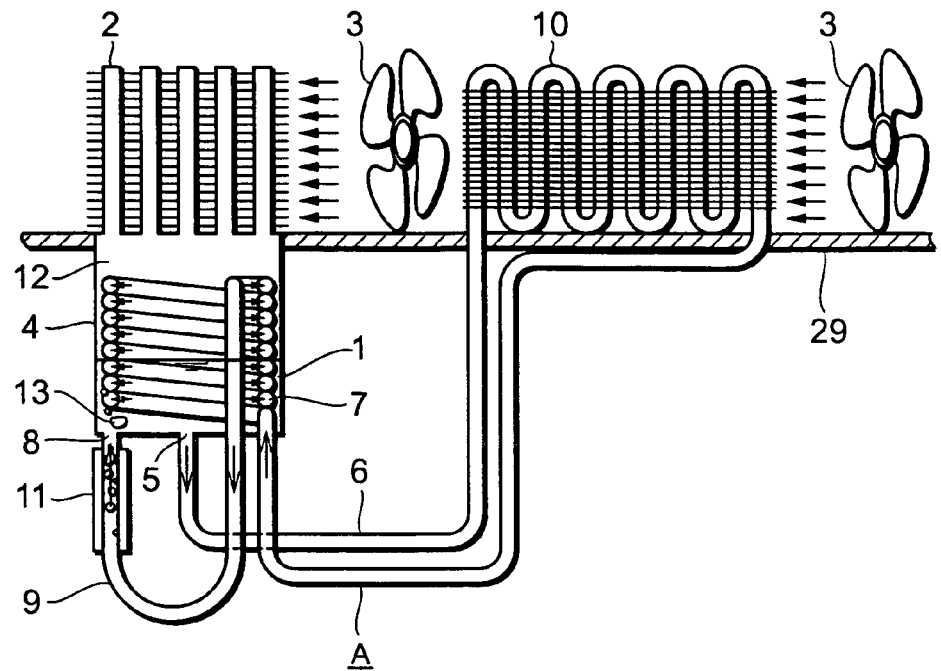
FIG. 19 is a cross-sectional schematic view illustrating a pump-free water-cooling system according to Embodiment 9 of the present invention.

FIG. 19 is a cross-sectional schematic view illustrating a pump-free water-cooling system according to Embodiment 9 of the present invention. In the present embodiment, as illustrated in FIG. 19, the heat radiator 2 and the sensible-heat-emitting heat exchanger 10 are provided above the ceiling of a case 29 or the like. In general, in cases where the heat radiator 2 is provided on the case 29, it is probable that the spatial height over the top portion of the case 29 will be limited. While, the latent heat transport system as heat pipes requires the large installation clearance, especially the higher spatial height, for the condenser of the system. Thus, the above limitation makes the latent heat transport system difficult to use as cooling system for electronic apparatus in the case 29. However, in the present invention, because the sensible-heat-emitting heat exchanger 10 that can be installed in any place is provided, heat can be radiated by means of the sensible-heat-emitting heat exchanger 10; therefore, usable installation space, above the case 29, having a low spatial height, but being large can effectively be utilized. As a result, heat can more effectively be radiated.

Embodiment 10

Figure 20:
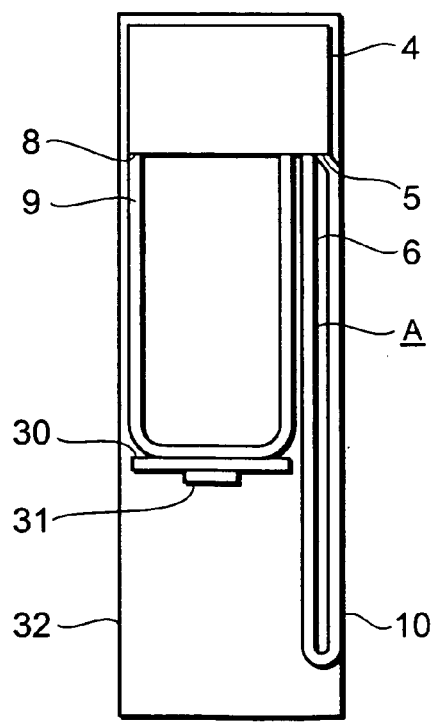
FIG. 20 is a cross-sectional schematic view illustrating a pump-free water-cooling system according to Embodiment 10 of the present invention.

FIG. 20 is a cross-sectional schematic view illustrating a pump-free water-cooling system according to Embodiment 10 of the present invention, in cases where the system is applied to cooling for an electronic apparatus such as a personal computer. Personal computers that are now in use generate a large amount of heat; therefore, forced-air-cooling heat radiation utilizing a fan has been adopted. Although the quietness performance of fans has been improved day by day, further quietness performance is being demand.

In the present embodiment, as illustrated in FIG. 20, the sensible-heat-emitting heat exchanger 10 is provided in a clearance in the vicinity of the sidewall, or inner bottom portion, of a personal computer 32, or the like; while a heat-generating component, such as a mother board 30, a CPU 31, or a memory, is disposed on the gas-liquid two-phase fluid charging pipe 9.

In this manner a fan is eliminated, and furthermore heat can effectively be radiated.

As a result, a fin-free heat-radiating system can be constituted, whereby a low-noise personal computer can be provided.

As this invention may be embodied in several forms without departing from the spirit of the essential characteristics thereof, the present embodiments are therefore illustrative and not restrictive, since the scope of the invention is defined by the appended claims rather than by the description preceding them, and all changes that fall within the metes and bounds of the claims, or the equivalence of such metes and bounds, are therefore intended to be embraced by the claims.

What is claimed is:

1. A pump-free water-cooling system, comprising:
   a heat-exchange circulating solution container in which heat-exchange circulating solution and vapor of the circulating solution are contained;
   a heat radiator provided on an outer wall of the container;
   a solution outlet for discharging from the container the heat-exchange circulating solution in the container;
   a gas-liquid two-phase fluid inlet for charging into the container gas-liquid two-phase fluid composed of the heat-exchange circulating solution at high temperature and vapor bubbles of the circulating solution;
   a first transportation route along which a sensible-heat-emitting heat exchanger is provided, the first transportation route linking with the solution outlet;
   a second transportation route along which heat exchange is carried out between heat-exchange circulating solution therein and the heat-exchange circulating solution in the container, or between the heat-exchange circulating solution therein, and the heat-exchange circulating solution in the container and the vapor of the heat-exchange circulating solution in the container;
   a third transportation route along which a heating heat exchanger is provided, the third transportation route linking with the gas-liquid two-phase fluid inlet; and
   a circulating-solution transporting route in which the first transportation route is linked to the second transportation route and the second transportation route is linked to the third transportation route.

2. A pump-free water-cooling system as recited in claim 1, wherein an auxiliary heat-exchange circulating solution container that links with the heat-exchange circulating solution container is provided, and a heating device for controlling a temperature in the auxiliary container is provided in the auxiliary container.

3. A pump-free water-cooling system as recited in claim 1, wherein the heat-exchange circulating solution container is provided with a plurality of solution outlets and a plurality of gas-liquid two-phase fluid inlets, and the solution outlets are linked through a plurality of circulating-solution transporting routes with respective gas-liquid two-phase fluid inlets.

4. A pump-free water-cooling system as recited in claim 1, wherein at least one of the first transporting route, the second transporting route, and the third transporting route includes a plurality of transporting routes divided by means of a distributing vessel and a collecting vessel.

5. A pump-free water-cooling system as recited in claim 1, wherein the circulating-solution transporting route has a plurality of second transporting routes, and includes, between two of the plurality of second transporting routes, a fourth transporting route provided with a sensible-heat-emitting heat exchanger.

6. A pump-free water-cooling system, as recited in claim 1, further comprising:
   one or more fifth transporting routes in which a heating heat exchanger and a sensible-heat-emitting heat exchanger are provided,
   wherein each of the one or more fifth transporting routes is located between the second transporting route and the first transporting route.

7. A pump-free water-cooling system, as recited in claim 6, wherein the heating heat exchanger provided in the third transporting route is a heater that can be controlled from outside.

8. A pump-free water-cooling system as recited in claim 1, wherein the third transporting route includes an auxiliary heater.

9. A pump-free water-cooling system as recited in claim 1, wherein
   the heat-exchange circulating solution container is provided with a plurality of solution outlets;
   the first transporting route links with the plurality of the solution outlets; and
   respective linking portions of the first transporting route that link with the plurality of the solution outlets join, linking with the second transporting route.

* * * * *